United States Patent [19]

Chickanosky et al.

[11] Patent Number: 4,681,221

[45] Date of Patent: Jul. 21, 1987

[54] HOLDER FOR PLASTIC LEADED CHIP CARRIER

[75] Inventors: John J. Chickanosky, Grand Isle; Jack W. Courtney, Underhill, both of Vt.; Robert H. Murphy, Merrimac, N.H.

[73] Assignee: International Business Machines Corporation, Armonk, N.Y.

[21] Appl. No.: 925,353

[22] Filed: Oct. 30, 1986

[51] Int. Cl.[4] .............................................. B65D 73/02
[52] U.S. Cl. .................................... 206/328; 206/486; 206/560
[58] Field of Search ............... 206/328, 334, 486, 560; 361/212

[56] References Cited

U.S. PATENT DOCUMENTS

| | | |
|---|---|---|
| 3,417,865 | 12/1968 | Suverkropp et al. . |
| 3,604,557 | 9/1971 | Cedrone . |
| 3,652,974 | 3/1972 | Tems . |
| 3,861,733 | 1/1975 | Vander Mey . |
| 3,892,312 | 7/1975 | Tems . |
| 3,954,175 | 5/1976 | Mason . |
| 4,200,191 | 4/1980 | Nakamura et al. . |
| 4,323,155 | 4/1982 | Kling . |
| 4,379,505 | 4/1983 | Alemanni . |
| 4,404,615 | 9/1983 | Dep . |
| 4,435,724 | 3/1984 | Ralstin . |
| 4,444,309 | 4/1984 | Morton, Jr. . |
| 4,448,306 | 5/1984 | Sinnadurai et al. . |
| 4,483,441 | 11/1984 | Akizawa et al. ..................... 206/328 |
| 4,533,043 | 8/1985 | Swain . |
| 4,535,887 | 8/1985 | Egawa . |
| 4,549,651 | 10/1985 | Alemanni . |
| 4,556,145 | 12/1985 | Putnam . |
| 4,564,880 | 1/1986 | Christ et al. . |

OTHER PUBLICATIONS

IBM Technical Bulletin, vol. 17, No. 6, Nov. 1974, Amaro et al., p. 1590.

Primary Examiner—Joseph Man-Fu Moy
Attorney, Agent, or Firm—Sughrue, Mion, Zinn, Macpeak & Seas

[57] ABSTRACT

An injection-molded single piece holder for a plastic leaded chip carrier having "J" leads. The holder is made of conductive plastic and has two flexible, snap-acting arms which engage the top surface of the chip carrier to retain it in the holder while at the same time protecting the "J" leads and leaving them exposed for testing. The holder has supporting surfaces with contours which match those of chip carriers to assure a predetermined orientation of each carrier in the holder. The holder has one or more locating notches for engaging corresponding ribs in a magazine to insure that plural holders stored in the magazine all have the same orientation within the magazine.

8 Claims, 10 Drawing Figures

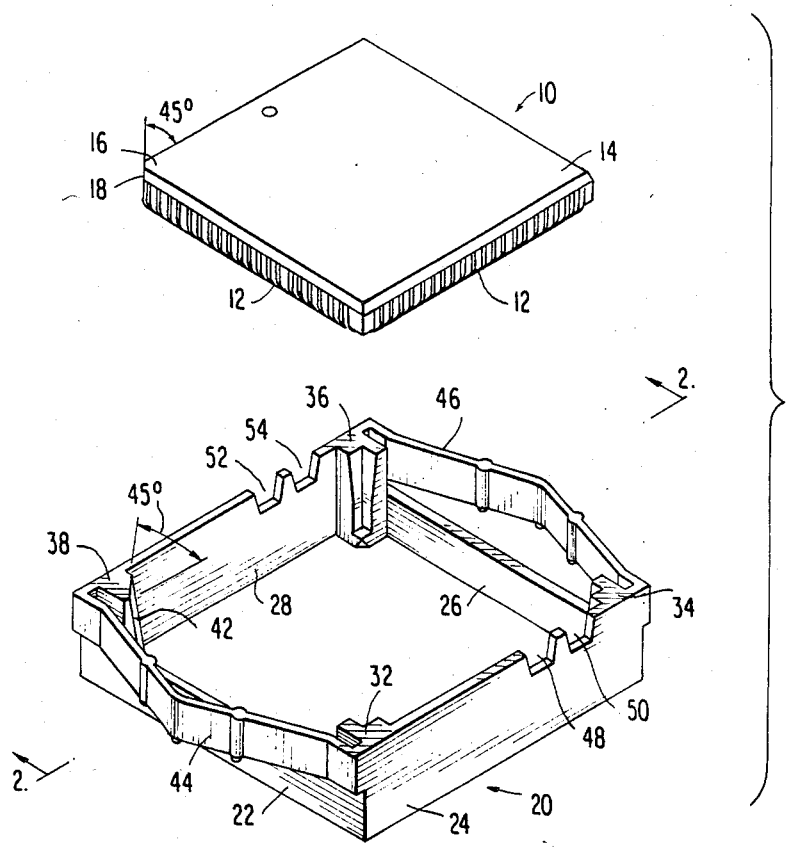
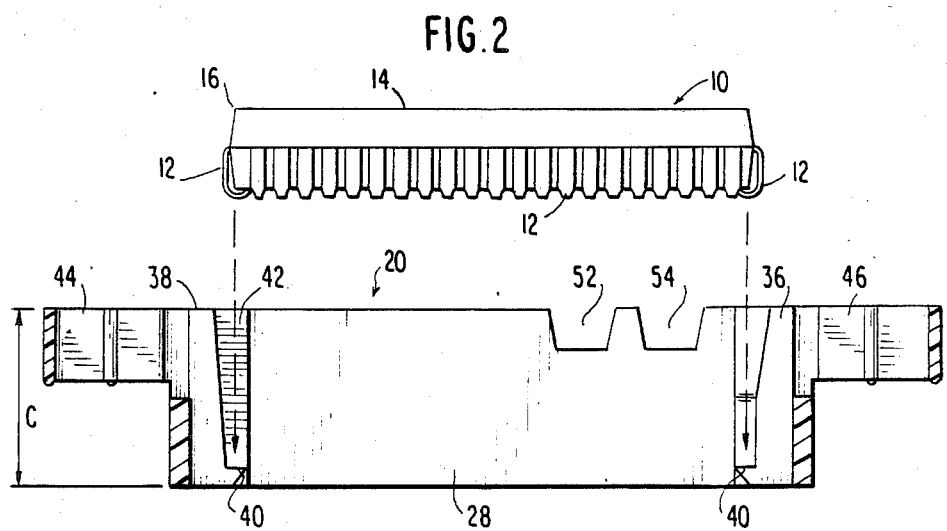

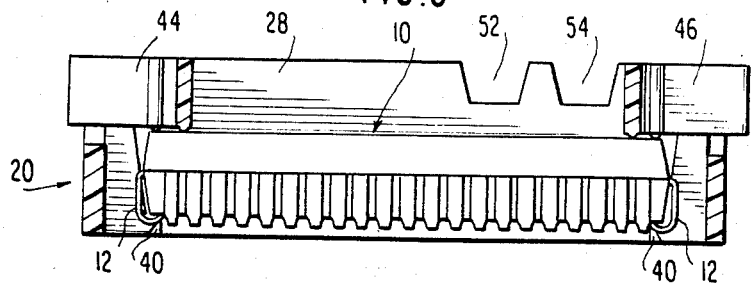
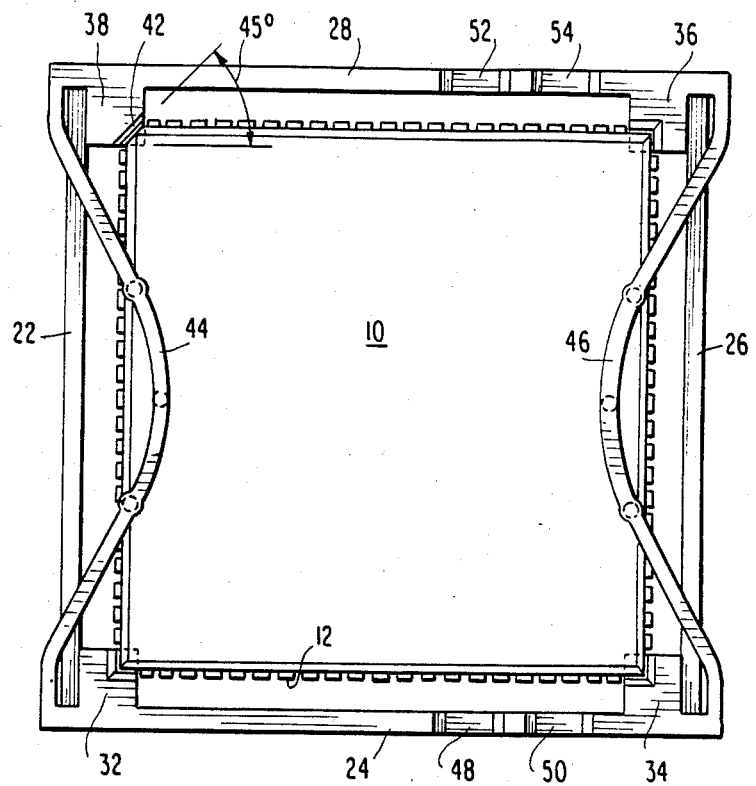
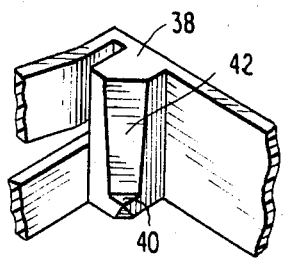

HOLDER FOR PLASTIC LEADED CHIP CARRIER

BACKGROUND OF THE INVENTION

1. Field of the Invention

This invention relates generally to the field of holders for integrated circuit carriers or modules and, more particularly, to such a holder adapted to a plastic leaded chip carrier (PLCC) or module having very soft and thin "J" leads.

2. Description of the Prior Art

The prior art is replete with various known holders which facilitate the testing, processing, storage and transportation of various integrated circuit carriers, modules, packages or devices, but none is suitable for providing protection for the very soft and thin leads of a PLCC having "J" leads and for allowing access to such leads while the PLCC is in the holder. More specifically, there is presently not available any holder capable of handling and shipping "J" lead PLCCs while meeting the mechanical requirements of card-surface mounting.

For example, U.S. Pat. No. 4,435,734—Ralstin discloses a single piece holder for a flatpack-type integrated circuit device having leads extending in opposite lateral directions; the holder has laterally extending grooves for receiving the leads and a pair of upstanding flexible tabs for resiliently engaging the top surface of the device to retain the device in the holder.

U.S. Pat. No. 4,379,505—Alemanni discloses a one-piece flatpack integrated circuit holder having four upstanding resilient retaining fingers which engage the leads of the flatpack to retain it in the holder.

U.S. Pat. No. 3,417,865—Suverkropp et al discloses a flexible one-piece holder for a flatpack integrated circuit and having a recess containing projections which normally retain the flatpack but which separate upon bending of the carrier in order to permit a flatpack to be inserted in, or removed from, the holder.

U.S. Pat. No. 4,535,887—Egawa discloses a multiple-piece holder for an integrated circuit package and contains a pair of pivotable levers which, in a closed position, lock the package in the holder and which, in an open position, permit the package to be inserted in, or removed from, the holder.

U.S. Pat. No. 3,954,175—Mason discloses a three-piece adjustable integrated circuit holder for accommodating varying sizes of integrated circuit packages and having deflectable hooks for engaging the top surface of a package to retain it.

U.S. Pat. No. 3,652,974—Tems discloses a one-piece holder for a flatpack integrated circuit module and having flexible retaining arms for holding the module in the holder.

U.S. Pat. No. 4,323,155—Kling discloses an integrated circuit package holder having a flexible sidewall for retaining the package and being made of a conductive plastic material which contacts the package leads to equalize electrical potentials generated by external electrical fields.

U.S. Pat. No. 4,564,880—Christ et al discloses a one-piece anti-static holder for an integrated circuit module.

U.S. Pat. No. 3,892,312—Tems discloses a one-piece molded plastic holder for a DIP integrated circuit package or module and having two upstanding resilient retaining arms for clamping the module in the holder.

U.S. Pat. No. 4,556,145—Putnam discloses a one-piece holder for flatpack chips of varying size and having a pair of resilient cantilevered arms for engaging the side of the chip to retain it in the holder.

U.S. Pat. No. 3,604,557—Cedrone discloses a flexible molded electrically-insulating holder for an electronic circuit module of wafer and includes four arms forming a deformable parallelogram within which the wafer is resiliently clamped by the four arms.

U.S. Pat. No. 4,404,615—Dep discloses an anti-static container for storing a plurality of electronic circuit boards on edge, and includes a conductive anti-static body liner which prevents the boards from being damaged by static charges.

IBM Technical Disclosure Bulletin, Vol. 17, No. 6, November 1974, p. 1590-Amaro et al discloses a one-piece snap-on protective cap for a chip module having leads extending perpendicularly to the plan of the module.

U.S. Pat. No. 4,444,309—Morton discloses a holder for a leadless integrated circuit chip and has a resilient cantilevered L-shaped arm which presses laterally against one corner of the chip to retain the chip and to leave the contact pads thereof exposed for probing.

U.S. Pat. Nos. 4,448,306—Sinnadurai et al, 4,200,191—Nakamura et al, 3,861,733—Mey, 4,549,651—Alemanni and 4,533,043—Swain disclose additional holders for chips and other electronic components.

SUMMARY OF THE INVENTION

The primary object of the invention is to provide a one-piece injection-moldable plastic holder for a plastic lead chip carrier (PLCC) having "J" leads.

Another object is to provide such a holder which protects a PLCC during handling and shipping and which exposes the leads so that the PLCC can be tested while it is in the holder.

A more specific object is to provide a single-piece injection-molded PLCC holder having a pair of opposing flexible snap-acting arms which engage the top surface of the PLCC to retain it in the holder.

A further object of the invention is to provide such a holder whose external dimensions are the same for any size PLCC.

Still another object is to provide such a holder which protects the "J" leads from mechanical damage and which protects the module and the integrated circuit chip contained therein from static charges.

Another object is to provide such a holder with contoured surfaces which match those of a PLCC to assure a predetermined orientation of the PLCC in the holder, and with locating notches which match corresponding ribs in a magazine to assure a predetermined orientation of all holders stored in the magazine.

The above objects are achieved by providing an injection-molded single piece holder made of conductive plastic and having two flexible, snap-acting arms which engage the top surface of the chip carrier to retain it in the holder while at the same time protecting the "J" leads and leaving them exposed for testing. The holder has supporting surfaces with contours which match those of chip carriers to assure a predetermined orientation of each carrier in the holder. The holder has one or more locating notches which engage corresponding ribs in a magazine to insure that plural holders stored in the magazine all have the same orientation within the magazine.

BRIEF DESCRIPTION OF THE DRAWING

FIG. 1 is a perspective view of a preferred embodiment of the PLCC holder of this invention and also of a PLCC itself;

FIG. 2 is a cross-sectional view taken along line 2—2 of FIG. 1 and also shows the manner in which a PLCC is inserted into the holder;

FIG. 3 is a cross-sectional view showing a PLCC inserted in the holder;

FIG. 4 is a top plan view of FIG. 3;

FIG. 5 is an enlarged perspective view showing the different contour of one support post of a preferred embodiment of the holder;

DETAILED DESCRIPTION OF THE PREFERRED EMBODIMENTS

Figure 6:
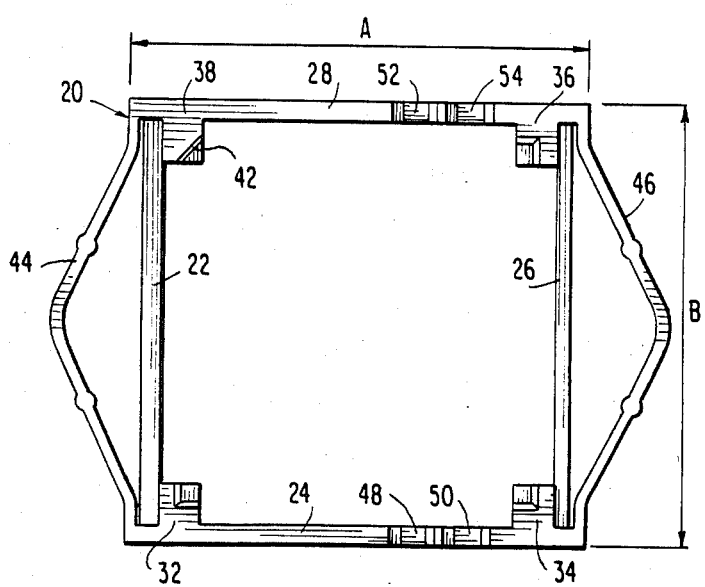
FIG. 6 is a top plan view of the holder in the open position and without a PLCC.

FIG. 1 is an exploded perspective view showing a rigid substantially square plastic leaded chip carrier (PLCC) 10 having embedded therein an integrated circuit chip (not shown) and conductors (not shown) connected to a plurality of external "J" leads 12 located along the four sides of the PLCC 10. The PLCC has a top surface 14 and four top edges and corners which are inclined slightly inwardly toward the center of the carrier 10 as shown in FIGS. 1 and 2. When the carrier 10 is viewed from the top, one sees that three of the four corners essentially form right angles, but that one corner 16 has a 45° chamfer which mates with a corresponding chamfer in the holder 20, as will be explained below.

The "J" shape of the leads 12 is clearly illustrated in FIG. 2 wherein it is shown that the top end of each lead 12 (connected to the internal integrated circuit) extends from the approximate vertical midpoint of PLCC 10, the extends substantially vertically downward, and then curves inwardly and upwardly into a small recess in the bottom of the carrier 12 to form the hook of the "J".

There is an industry-recognized problem of "handling" such PLCCs, i.e. testing or processing, storing and shipping them. The holder 20 is designed to protect the PLCC or module from both mechanical and electrical damage from the time leads 12 are formed, through testing, inspection and shipping. The PLCC 10 is placed in the holder 20 immediately after formation of the PLCC. The holder 20 containing the PLCC 10, can be placed in an automatic tester, thereby eliminating manual one-at-a-time testing. Holder 20 both mechanically and electrically protects the "J" leads of the PLCC 10, while at the same time permitting access to the leads for testing of the embedded integrated circuit.

The "J" leads are particularly vulnerable to mechanical damage because they are made of very soft copper material and typically have both a thickness and a width of only eight mils. With permissible mechanical dimension tolerances of only 0.004 inch for planarity (flatness of the "J" leads when the PLCC is placed on a flat surface with the bottoms of the leads in contact with the surface) and of only 0.005 inch for lead bend (the bend from side to side), anytime a PLCC is handled "naked" after forming thereof, it is in jeopardy of being damaged. If damage should occur, human operators must use a microscope and tweezers and attempt to straighten the leads one at a time as their is presently no automated means capable of straightening the leads once they are bent. However, when a PLCC is placed in the holder 20, the PLCC can be handled without fear of any damage.

To protect against damage to the PLCC from electrostatic discharges, the holder 20 is made of a conductive material, such as a carbon filled plastic. More specifically, a material which is found to be suitable is modified NYLON 6 plastic from LNP which can be injection-molded and which offers the properties of high mechanical strength, spring action of the snap-acting arms (to be described below) and an ability to withstand temperatures of 150° C. for short periods of time. Such temperature stability allows the PLCC to be marked with ink which can be cured while the PLCC is in the holder. The preferred range of surface resistivity of the holder 20 is $10^{-6}$ to $10^{-11}$ ohms/sq.

Structurally, holder 20 corresponds in shape to that of PLCC 10 and has four wide walls 22, 24, 26 and 28 forming four interior corners in which integral shoulders 32, 34, 36 and 38, respectively, are formed. As shown in FIGS. 1, 2 and 3, each of the shoulders has an inwardly projecting lip 40 on which rests a corresponding lower corner of the PLCC 10 when the PLCC is inserted in the holder 20 as illustrated in FIG. 3. As seen from FIG. 1, the corners PLCC 10 are free of "J" leads 12; therefore, when the PLCC 10 is inserted in the holder 20, the holder does not contact any of the leads in the PLCC. On the other hand, the level of the lips 40 is such that the bottom surfaces of the "J" leads are located above the lower edges of the side walls of the holder 20, whereby the leads are well protected from mechanical damage while at the same time being accessible for probing during electrical testing of the PLCC.

The internal corners of the three supporting shoulders 32, 34 and 36 form 90° angles which mate with the three right-angled corners of PLCC 10. However, the fourth supporting shoulder 38 has a 45° flat or chamfer 42 which mates with the chamfer 18 on the corner 16 of PLCC 10. Thus, since the PLCC 10 is always inserted in the holder 20 with the "J" leads pointing downwardly, holder 20 will accept a PLCC in only one angular orientation, i.e. that orientation in which the chamfer 18 on PLCC corner 16 mates with the chamber 42 on the holder supporting shoulder 38.

Formed in the two opposing side walls 22 and 26 of holder 20 are two flexible, snap-acting bistable retaining arms or clips 44 and 46, respectively. In FIGS. 1, 2 and 6, the snap-acting arms are shown in their outward or "open" positions in which a PLCC 10 may be inserted into the holder 20 or removed therefrom. In FIGS. 3 and 4, the snap-acting arms 44 and 46 are shown in their inward or "closed" positions in which they engage the top surface 14 of the PLCC 10 to clamp or retain it between the lower surfaces of the snap-acting arms and the lips 40 of the supporting shoulders 32, 34, 36 and 38. The opposite ends of each of the snap-acting arms 44 and 46 are formed integrally with the top portions of the corresponding side walls 22 and 26, each of the top portions projecting slightly outwardly from the corresponding bottom portion of a side wall. As shown in FIG. 1, each arm is longer than its corresponding side wall and, thus, is bowed outwardly. Each of the snap-acting retaining arms or clips 44 and 46 is flexible and is bistable in operation in that, once it is moved over it center position (approximately defined by its alignment with the bottom portion of its corresponding side wall), it continues in the same direction and snaps into a stable position, either "opened" or "closed". Such a one-piece holder structure, other than being easily and cheaply manufactured by an injection molding process, permits the holder to be maintained in its "open" position (i.e. with both snap-acting arms 44 and 46 in their outward positions) without the application of any external force to maintain the "open" position. The four inner corners of the supporting shoulders 32, 34, 36 and 38 are inclined slightly outwardly from the bottom to the top thereof, in order to facilitate the insertion of the PLCC 10 until its four bottom corners rest on the supporting lips 40.

Formed in the top edge of each of the opposing side walls 24 and 28 are respective pairs of locating notches 48, 50 and 52, 54 which are designed to mate with corresponding locating ribs in a magazine or container in which a plurality of holders 20 are stored or stacked, each holder containing a PLCC 10, thereby assuring that all of the holders can be inserted in the magazine with only the same orientation. Instead of a pair of notches in each side wall, only one notch may be used.

In order that the same automatic testing equipment, storage magazines etc. may be used for different sizes of PLCCs, it is desirable that the external dimension of the PLCC holder be the same for all sizes of PLCCs. Assuming that a PLCC forms a square, then the size of the square will vary according to the size of the PLCC. The size of a PLCC is usually designated by the number of "J" leads, which number can range from 44 (11 on the side) to 88 (22 on a side).

Figure 7:
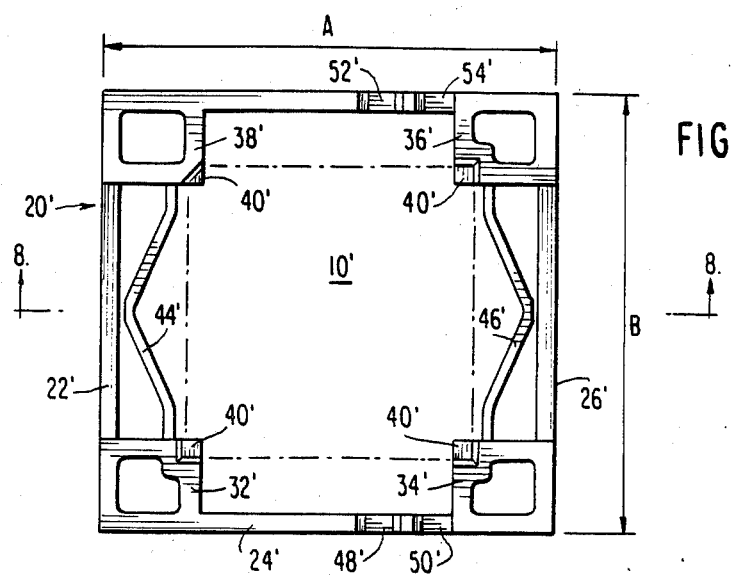
FIG. 7 is a top plan view of another embodiment of the holder, in the open position and showing an inserted PLCC in phantom lines.
Figure 8:
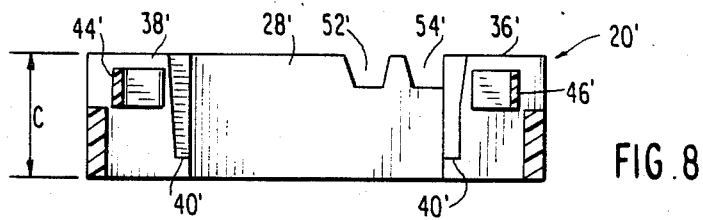
FIG. 8 is a cross-sectional view taken along line 8—8 of FIG. 7.

For comparison purposes, FIG. 6 shows a plan view of the holder 20 designed for a relatively large PLCC, and FIG. 7 is a plan view of a modified holder 20' designed for a smaller PLCC 10'. For ease of comparison, the reference numerals used in FIGS. 7 and 8 are the same as those used in FIGS. 1-6 but with a prime ('). It is seen that the external dimensions A, B and C are the same for the embodiment of FIGS. 1-6 and the embodiment of FIGS. 7-8. However, the internal supporting dimensions of the modified holder 20' are smaller than those of holder 20. More specifically, the supporting shoulders 32', 34', 36' and 38' are larger and, thus, extend further inwardly toward the center of holder 20' so that the supporting lips 40° are properly located to receive and support the four corners of the smaller PLCC 10'. Similarly, the snap-acting retaining arms 44' and 46' are formed correspondingly inwardly on the supporting shoulders so that the retaining arms 44' and 46' (shown in their outward or open positions in FIGS. 7 and 8) will retain the PLCC10 ' when they are snapped inwardly to their closed positions. In the embodiment of FIGS. 7 and 8, since the supporting shoulders 32', 34', 36' and 38' are larger, they are molded to be hollow to save weight and material.

Figure 9:
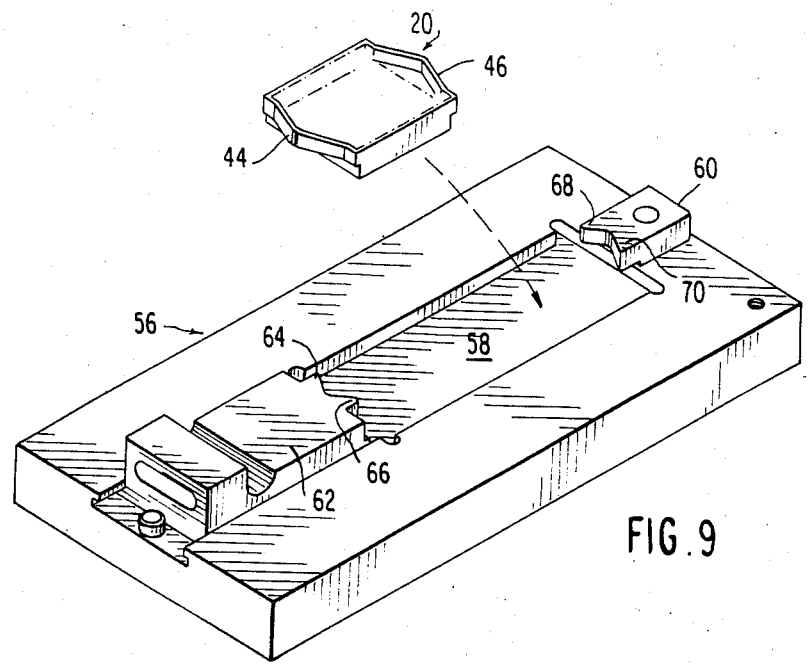
FIG. 9 is a perspective view of a fixture suitable for shaping the snap-acting arms of a holder before its first use.
Figure 10:
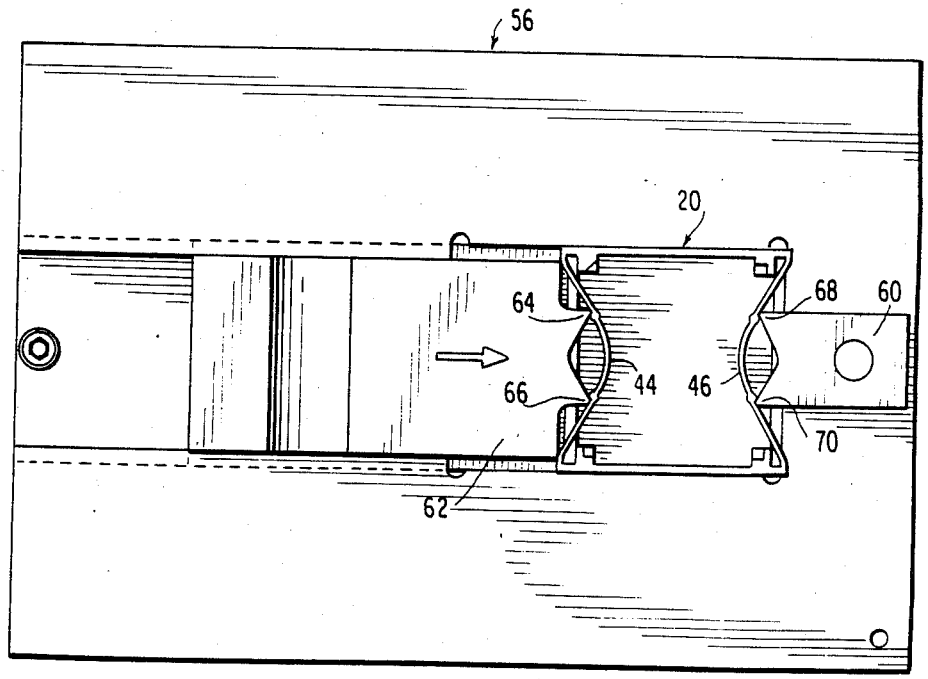
FIG. 10 is a plan view showing the operation of the fixture on the arms of a holder.

FIGS. 9 and 10 show a metal fixture 56 which is useful in forming a memory in the snap-acting retaining arms 44 and 46 after the holder 20 has been molded but before its first use. Fixture 56 has an elongated rectangular cavity or recess 58 designed for receiving the PLCC holder 20. Fixed to the body of the fixture 56 at one end of cavity 58 is a stationary jaw 60, and a movable jaw 62 is mounted at the opposite end of the cavity in slots to permit sliding movement of the jaw 62 along the length of the cavity 58.

As shown in FIG. 9, the holder 20 is inserted in the open cavity 58 with the retaining arms 44 and 46 in their outward or open positions, i.e. their positions immediately after molding. Then, as shown in FIG. 10, the movable jaw 62 is moved longitudinally to the right until the pairs of points 64, 66 and 68, 70 of the jaw 62 and 60, respectively, apply pressure to each arm at points located approximately one-third of the distance from the opposite ends of each arm. Continued movement of the jaw 62 to the right causes both arms to be uniformly moved inwardly to their inward or closed bistable position, thereby forming a memory in the arms so that, after they are removed from the fixture and snapped to their outward or open bistable position, they will once again assume the closed bistable position when appropriately inwardly directed forces are applied to the arms. This memory-forming operation can also be done manually with one's fingers, but the use of the fixture provides a more uniform snap-action.

Even though the foregoing description has referred to the holder of this invention as being designed for a PLCC having "J" leads with inwardly-extending hooks, it is to be understood, of course, that the holder can be used for other modules, such as, for example, a PLCC having "J" leads with outwardly-extending hooks and known as "gull-wing" leads.

I claim:

1. A single-piece substantially rectangular molded plastic holder for a substantially rectangular integrated circuit module having external leads extending along the bottom of the module, said holder comprising:

four vertical side walls forming a substantially rectangular, vertically-extending cavity for receiving a module inserted in the cavity from the top of the holder, said four side walls forming four corresponding internal corners of said holder;

and inwardly extending supporting means, in each of said corners, for supporting a corresponding one of the four corners of an inserted module so that the bottom surface of the module is above the bottom edges of said side walls and so that the leads are accessible through the bottom of the holder; and flexible, snap-acting bistable retaining arm means for clamping a module in said holder;

each of said retaining arm means being formed integrally with said holder and having opposite arm ends fixed at opposite points along a line parallel to a respective one of a first pair of opposing side walls;

said retaining arm means having an outwardly-extending first stable position in which the cavity is open for the insertion or removal of a module, and an inwardly-extending second stable position in which the cavity is closed;

the vertical height of an operative portion of the module-receiving cavity being defined by the vertical distance between said supporting means and lower edges of said retaining arm means.

2. A holder, as defined in claim 1, made of conductive plastic material for dissipating static charges.

3. A holder as defined in claim 1, wherein each retaining arm means comprises a bowed flexible strip whose length is greater than the distance between said opposite arm ends.

4. A holder as defined in claim 3, wherein one of the four supporting means has a surface contour which is different from that of the other three supporting means and which matches a surface contour of only one of the corners of an inserted module.

5. A holder as defined in claim 4, further comprising locating notch means, formed in the top edges of a different pair of opposing side walls, for mating with corresponding locating ribs in a module-storing magazine.

6. A holder as defined in claim 3, wherein each flexible strip is formed in an outwardly-extending top portion of a side wall, and said line is outside said side wall.

7. A holder as defined in claim 3, wherein each flexible strip is formed between an adjacent pair of said inwardly-extending supporting means, and said line is inside said side wall.

8. A holder as defined in claim 1, wherein the inwardly-extending supporting means are positioned to contact lead-free corners of a module in the form of a plastic leaded chip carrier having "J" leads along the four sides thereof, but not at the corners thereof which are contacted by said supporting means.

* * * * *